United States Patent [19]

Stein

[11] 3,882,421

[45] May 6, 1975

[54] LOW POWER PULSE GENERATOR

[75] Inventor: Jeffrey P. Stein, Devon, Pa.

[73] Assignee: Honeywell, Inc., Minneapolis, Minn.

[22] Filed: June 29, 1973

[21] Appl. No.: 375,100

Related U.S. Application Data

[63] Continuation of Ser. No. 256,904, May 25, 1972, abandoned.

[52] U.S. Cl. .............................. 331/111; 307/252 F
[51] Int. Cl. .............................. H03k 3/335
[58] Field of Search .......... 331/111; 307/252 F, 283

[56] References Cited

UNITED STATES PATENTS

| | | | |
|---|---|---|---|
| 3,045,148 | 7/1962 | McNulty et al. | 331/111 |
| 3,644,918 | 2/1972 | Perlman | 307/252 F |

OTHER PUBLICATIONS

Radio–Electronics, R. W. Fox, Pgs. 50–52, Oct. 1970.
Electronic Circuits Manual, Pg. 623, by Markus, 1971.
Electronics, K. J. Foord, Pgs. 96, 97, Oct. 2, 1967.

*Primary Examiner*—John Kominski
*Attorney, Agent, or Firm*—Arthur H. Swanson; Lockwood D. Burton; Mitchell J. Halista

[57] ABSTRACT

A pulse generator circuit using a programmable unijunction transistor produces an output pulse by turning "on" the transistor by means of an integrator circuit connected across the anode and cathode of the transistor and integrating an output of a power supply while the turn-off of the transistor is achieved by exceeding a normal gate electrode current of the transistor. The augmented gate electrode current is produced by a conductive state of a zener diode to produce a low impedance, high current path to the gate electrode whereby the transistor is turned "off" shortly after the transistor has been turned "on" by the integrator. The output pulse is generated by an output transistor responsive to an inductor in the cathode circuit of the unijunction transistor which inductor produces a back voltage with a decrease in the cathode circuit current to turn "off" the output transistor.

6 Claims, 1 Drawing Figure

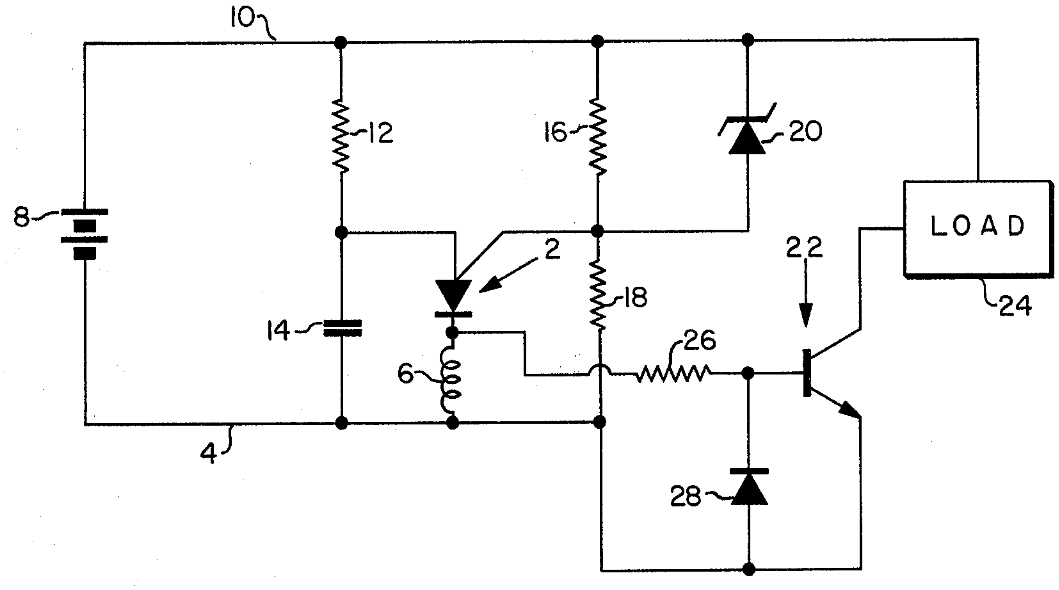
10
12
16
20
8
LOAD
2
22
18
14
26
24
6
4
28

LOW POWER PULSE GENERATOR

This is a continuation of application Ser. No. 256,904 filed on May 25, 1972 and now abandoned.

The present invention relates to oscillator circuits. More specifically, this invention relates to an oscillator circuit for producing an output pulse having a predetermined duration and frequency.

An object of the present invention is to provide an oscillator circuit for producing an output signal having a predetermined duration and frequency with a waveshape characterized by fast rise and fall times while requiring ultra low power from a power supply.

SUMMARY OF THE INVENTION

In accomplishing these and other objects, there has been provided, in accordance with the present invention, an oscillator circuit including a unijunction transistor having an anode electrode, a cathode electrode and a gate electrode. Ramp signal generating means are connected to the anode electrode and the cathode electrode to energize the unijunction transistor while current drain means are connected to the gate electrode and the cathode electrode to de-energize the unijunction transistor after a predetermined time following the energization thereof by the ramp signal generating means.

An output transistor is connected across a reactive impedance in the cathode circuit of the unijunction transistor to generate an output signal representative of current changes through the reactive impedance produced by the turn-on and turn-off of the unijunction transistor.

BRIEF DESCRIPTION OF THE DRAWINGS

A better understanding of the present invention may be had when the following detailed description is read in connection with the accompanying drawing in which the single figure is a schematic illustration of a pulse generator embodying the present invention.

DETAILED DESCRIPTION

Referring to the single figure drawing in more detail, there is shown a pulse generator circuit using a programmable unijunction transistor (PUJT) 2 having a cathode electrode connected to a common return or ground line 4 through a reactive impedance element shown as an inductor 6. A source of an energizing signal V, shown as a battery 8, is connected between the common return, or ground, line 4 and a power supply line 10. A serial combination of a resistor 12 and a capacitor 14 is connected between the supply line 10 and the common return 4 with one end of the resistor 12 being connected to the supply line 10. One end of the capacitor 14 is connected to the common return line 4 while the junction therebetween is connected to an anode electrode of the unijunction 2. A pair of resistors 16 and 18 are connected between the supply line 10, and the common return line 4 with the junction therebetween connected to a gate electrode of the unijunction 2 and through a zener diode 20 to the supply line 10. An output transistor 22 has a collector electrode connected to an output load 24 and an emitter electrode connected to the common supply line 4. The base electrode of the output transistor 22 is connected through a resistor 26 to the base of the unijunction 2 and through a diode 28 to the common return line 4.

The operation, the circuit uses a unijunction transistor 2 to produce a low duty cycle, high energy output pulse in the load 24. This output pulse is characterized by rise and fall times while using low power from the energizing source 8. The resistors 16 and 18 from a voltage divider which sets the firing voltage for the unijunction transistor at: $R_{18}/R_{16} + R_{18}$ V. Assume the zener diode 20 is initially in a non-conducting state whereby it presents a high impedance path to current from the source 8. The resistor 12 allows a charging of the capacitor 14 to produce a ramp signal at the junction of the resistor 12 and capacitor 14 until the voltage on the cathode electrode of the unijunction transistor 2 exceeds the voltage on the gate electrode of the unijunction transistor 2 set by the voltage divider resistors 16, 18 by the appropriate threshold voltage, e.g., 0.7 volts. This voltage level on the cathode electrode turns "on" the unijunction transistor 2 whereby the capacitor 14 is able to discharge through the unijunction transistor 2 into the inductor 6 and into the base of the output transistor 22. This current flow into the base of the transistor 22 produces an output pulse at the collector of transistor 22 which output pulse is applied to the load 24.

In the "on" state of the unijunction transistor 2, the current flowing from the source 3 through the resistor 12 forms an anode current for the transistor 2 having a value in excess of a specified value called the valley, or sustaining, current. This valley current is related to the gate electrode current from the transistor whereby the anode current supports, by a current gain in the unijunction transistor 2, a gate current from the source 8 through the resistor 16. The unijunction transistor 2 will not turn "off", i.e., it is latched "on", unless the current demand by the gate electrode exceeds the value that can be sustained by the current gain action of the unijunction transistor 2 from the current supplied through resistor 12 whereby the anode current falls below the sustaining current value. The gate electrode current flow through the resistor 16 decreases the voltage at voltage divider junction to a level which turns "on" the zener diode 20. The zener diode 20 in its conducting state provides a very low impedance path to the supply 8 from the gate electrode thus making the gate electrode current far in excess of its latch-up value. This current demand, in turn, insures the turn-off of the unijunction transistor 2 and produces a restoration of the aforesaid initial state whereby to produce a succession of output pulse, i.e., oscillation during the "off" state of the oscillator. The zener diode 20 allows the resistors 16 and 18 to be very large, e.g., 2 megohms, thus requiring very little current drain from the source 8. The inductor 6 provides for very fast fall time on the output pulse supplied to the load 24 by a sore of energy from the capacitor 14 when the unijunction transistor 2 conducts to discharge the capacitor 14. Subsequently, when the unijunction 2 turns "off", the inductor 6 dissipates its stored energy by producing a back-voltage to drive the junction between the inductor 6 and the cathode of the unijunction transistor 2 in a negative direction to maintain the magnetic flux in the inductor 6. This back-voltage is applied to the base of the transistor 22 through the resistor 26 and very rapidly turns "off" the output transistor 22 to produce a fast fall time on the trailing edge of the output pulse in the load 24. Subsequent operation of the oscillator circuit is a repetition of the above operation starting with a charging of the capacitor 14 through the resistor 12.

Accordingly, it may be seen that there has been provided, in accordance with the present invention, a pulse generator circuit for producing a low duty cycle, high energy pulse with fast rise and fall times while using a minimal amount of power from a circuit energizing source.

The embodiments of the invention in which an exclusive property or privilege is claimed are defined as follows:

1. A pulse generator comprising:

a programmable unijunction transistor having an anode electrode, a cathode electrode and a gate electrode;

energizing means connected to said anode electrode and to said cathode electrode to energize said unijunction transistor into a current conducting state;

de-energizing means connected to said gate electrode to de-energize said unijunction transistor to terminate said current conducting state after a predetermined time following the energizing of said unijunction transistor by said energizing means, said de-energizing means including current path means providing a current path to said gate electrode after said predetermined time, said current path having a current demand greater than the current capable of being supplied by said unijunction transistor from said gate electrode, said current path means including a first current path means connected between said gate electrode and a source of energizing current and a second current path means connected between said gate electrode and said source of energizing current and arranged to provide a low impedance current path upon the occurrence of a predetermined current in said first current path means, said second current path means including a Zener diode and said first current path means including a voltage generator means arranged to produce a voltage representative of a current flow in said first current path means and circuit means connecting said voltage generator means to said Zener diode to back-bias said Zener diode into a nonconducting state upon the occurrence of a first level of current flow in said first current path and to bias said Zener diode into a conducting state upon the occurrence of a second level of current flow in said first current path means.

2. A pulse generator as set forth in claim 1 and including impedance means connected to provide a current path to said cathode electrode of said unijunction transistor and output means connected to said impedance means and responsive to signals developed across said impedance means to produce an output signal from said pulse generator circuit.

3. A pulse generator as set forth in claim 2 wherein said impedance means is an inductor.

4. A pulse generator as set forth in claim 1 wherein said energizing means connected to said anode electrode and said cathode electrode is a ramp signal generating circuit.

5. A pulse generator circuit as set forth in claim 4 wherein said ramp generator circuit includes a source of energizing current and a capacitor arranged to be energized by said source of energizing current.

6. A pulse generator as set forth in claim 2 wherein said impedance means includes a reactive impedance element arranged to provide a current path to said cathode electrode of said unijunction transistor and an output transistor having a base electrode connected to said cathode electrode of said unijunction transistor and emitter electrode arranged to provide a current path to said output transistor and a collector electrode connected to an output circuit.

* * * * *